United States Patent [19]
Murphy et al.

[11] Patent Number: 5,233,243
[45] Date of Patent: Aug. 3, 1993

[54] SUPERCONDUCTING PUSH-PULL FLUX QUANTUM LOGIC CIRCUITS

[75] Inventors: John H. Murphy, Churchill; Michael R. Daniel, Monroeville; John X. Przybysz, Penn Hills, all of Pa.

[73] Assignee: Westinghouse Electric Corp., Pittsburgh, Pa.

[21] Appl. No.: 744,729

[22] Filed: Aug. 14, 1991

[51] Int. Cl.$^5$ .................... H03K 19/195; H03K 19/20
[52] U.S. Cl. .................................... 307/476; 307/277; 307/462; 365/162
[58] Field of Search .............. 307/476, 277, 245, 306, 307/462; 365/162

[56] References Cited

U.S. PATENT DOCUMENTS

| | | | |
|---|---|---|---|
| 4,117,354 | 9/1978 | Geewala | 307/306 |
| 4,275,314 | 6/1981 | Fulton | 307/462 |
| 4,330,841 | 5/1982 | Yamada et al. | 307/476 X |
| 4,371,796 | 2/1983 | Takada | 307/476 |
| 4,570,087 | 2/1986 | Matheron et al. | 307/476 X |
| 4,603,263 | 7/1986 | Tahara et al. | 307/277 |

FOREIGN PATENT DOCUMENTS

| | | | |
|---|---|---|---|
| 0095979 | 12/1983 | European Pat. Off. | 307/476 |
| 0063134 | 5/1980 | Japan | 307/476 |
| 0145435 | 9/1982 | Japan | 307/306 |
| 0146125 | 8/1983 | Japan | 307/277 |
| 0146127 | 8/1983 | Japan | 307/277 |
| 0091727 | 5/1984 | Japan | 307/476 |
| 0191938 | 10/1984 | Japan | 307/445 |
| 0239123 | 11/1985 | Japan | 307/277 |
| 0262321 | 11/1986 | Japan | 307/476 |

OTHER PUBLICATIONS

Mukhanov, O. A. et al., "Ultimate Performance of the RSFQ Logic Circuits", IEEE Transactions on Magnetics, vol. MAG-23, 759-762, 1987.
Likharev, K. K. et al., "RSFQ Logic/Memory Family: A New Josephson-Junction Technology for Sub-Terahertz-Clock-Frequency Digital Systems", IEEE Transactions on Applied Superconductivity, vol. 1, No. 1, Mar. 1991.
Likharev, K. K., "Progress and Prospects of Superconductor Electronics", Supercond. Sci. Technol., vol. 3, pp. 325-337, 1990.
Likharev, K. K. et al. "Resistive Single Flux Quantum Logic for the Josephson-Junction Digital Technology", SQUID 1985—Superconducting Quantum Interference Devices and Their Applications, Walter de Gruyter & Co., Berlin, 1103-1108, 1985.
Koshelets, V. P. et al., "Experimental Realization of a Resistive Single Flux Quantum Logic Circuit", IEEE Transactions on Magnetics, vol. MAG-23, 755-758, 1987.
Kaplunenko, V. K. et al., "Experimental Study of the RSFQ Logic Elements", IEEE Transactions on Magnetics, vol. MAG-25, 861-864, 1989.
Mukhanov, O. A. et al., "RSFQ Logic Arithmetic", IEEE Transactions on Magnetics, vol. MAG-25, 857-860, 1989.
Mukhanov, O. A. et al., "Recent Development of Rapid Single Flux Quantum (RSFQ) Logic Digital Devices", Extended Abstracts of the 1989 International Superconductivity Electronics Conference (ISEC 1989), 557-560, 1989.

Primary Examiner—Eugene R. LaRoche
Assistant Examiner—Son Dinh
Attorney, Agent, or Firm—R. P. Lenart

[57] ABSTRACT

Push-pull flux quantum superconducting digital logic circuits are provided with a circuit branch having a pair of Josephson junctions electrically connected in series with each other. This circuit branch is connected between positive and negative bias voltage supplies which supply a bias current to the Josephson junctions. A dual polarity input voltage signal is applied to a node in the circuit branch and an output signal is extracted from a second node in the circuit branch. Various logic operations can be performed on the input signal by adding additional components and changing the points at which voltage is input to and output from the Josephson junction circuit branch.

32 Claims, 6 Drawing Sheets

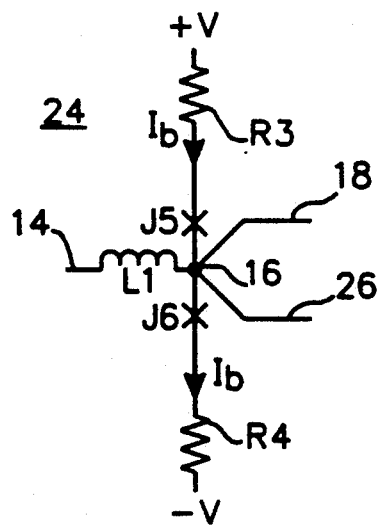
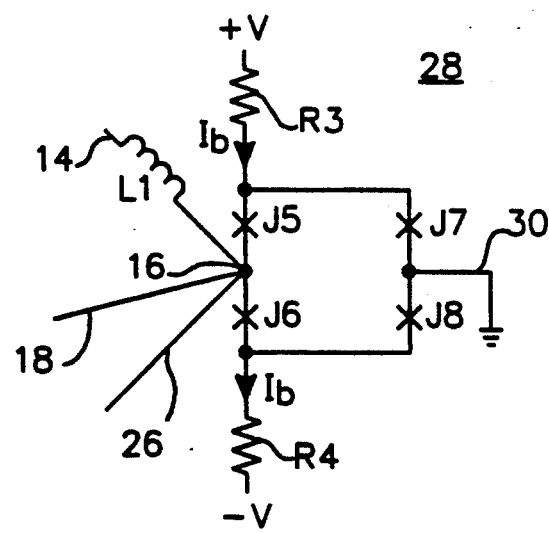
FIG. 4  FIG. 5
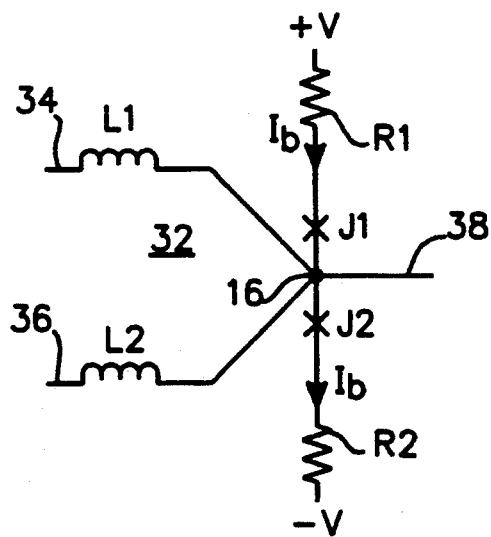
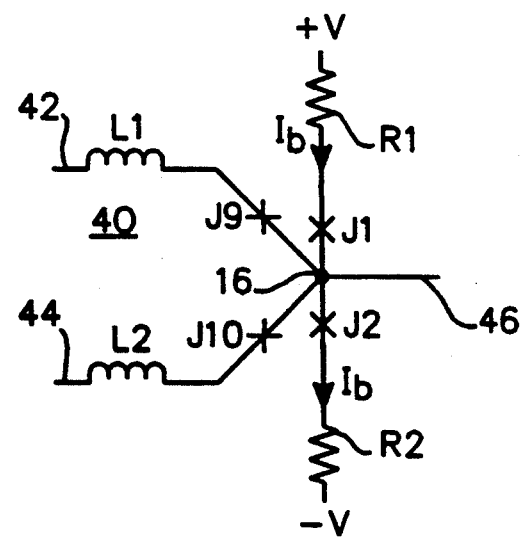
FIG. 6  FIG. 7

SUPERCONDUCTING PUSH-PULL FLUX QUANTUM LOGIC CIRCUITS

BACKGROUND OF THE INVENTION

This invention relates to superconducting circuits and, more particularly, to synchronous, digital superconducting logic circuits.

Josephson junctions have the ability to switch from the zero voltage state to a non-zero voltage state in times on the order of picoseconds, with the switching being limited by the resistive-capacitive time constant of the junction. Both hysteretic and non-hysteretic Josephson junctions have been used to construct high speed circuits having low power dissipation. There are two physical principles upon which data can be stored in Josephson logic systems. The first approach is to encode the stored data as a voltage across the Josephson junction. The second approach is to encode the stored data as magnetic flux trapped in a persistent superconducting loop. The smallest amount of magnetic flux for which the latter approach can be applied is a single flux quanta $\Phi_O$.

There are two physical principles upon which data can be transferred throughout a Josephson logic system. The first approach is to encode the data to be transferred as an electric current. The second approach is to encode the data to be transferred as a voltage pulse, V. For single flux quanta, the area of the voltage pulses that will allow logic functions to be performed within the superconducting loops is given by:

$$\int V(t)\,dt = +\Phi_O \quad (1)$$

where t represents time.

The logic representation used in superconducting circuits is vitally important to how the circuits perform signal inversion. In the classical representation, where a logic TRUE is represented by a positive voltage and a logic FALSE is represented by a zero voltage, signal inversion must be accomplished by timed-inversion. Since the superconducting phenomena does not support a three terminal transistor-like circuit, all state-of-the-art superconducting digital electronic circuits have only achieved signal inversion by signal interaction with an auxiliary timing signal. This timed inversion feature inherent in state-of-the-art superconducting digital electronic circuits limits their processing speed.

One type of superconducting digital logic circuit encodes a binary unity/zero as the presence/absence of a DC voltage across an unshunted Josephson tunnel junction with a hysteretic current-voltage curve. Such "latching" circuits must be AC powered so that they can be reset to the initial superconducting state and this resetting must be slow enough to avoid punch through effects.

A second type of superconducting digital logic circuit uses the presence/absence of a single flux quanta in superconducting quantum interferometers to store the information. Such circuits are termed Resistive or Rapid Single Flux Quantum (RSFQ) circuits. General background information on RSFQ circuits can be found in an article by A. O. Mukhanov et al., entitled "Ultimate Performance of the RSFQ Logic Circuits", in IEEE Transactions on Magnetics, Volume MAG-23, No. 2, March 1987 and an article by K. K. Likharev and V. K. Semenov, entitled "RSFQ Logic/Memory Family: A New Josephson-Junction Technology for Sub-TeraHertz-Clock-Frequency Digital Systems", in IEEE Transactions on Applied Superconductivity, Vol. 1, No. 1, March 1991.

All RSFQ logic circuits are timed or clocked circuits. That is, they need two signals to define the information, a timing signal to define the interval for valid data and a data signal for defining the data being transmitted. This approach slows the speed at which data can be transmitted by a factor of two. In addition, RSFQ circuits are asynchronous so that they must trap and store intermediate calculations for future readout. This feature forces the inclusion of interferometers in each logic circuit. Interferometers, even for single magnetic flux quanta trapping, are spatially large circuits.

It is therefore desirable to devise a family of superconducting digital logic circuits which do not require an ac bias source, a separate timing signal, or the use of interferometers in each logic circuit.

SUMMARY OF THE INVENTION

Superconducting digital logic circuits constructed in accordance with this invention include a circuit branch having a pair of Josephson junctions electrically connected in series with each other. This circuit branch is connected between positive and negative bias voltage sources which apply a bias current to the junctions. An input voltage signal is applied to a node in the circuit branch such that the operating state of the Josephson junctions is controlled by the magnitude and polarity of voltage pulses in the input signal. An output voltage signal is extracted from the circuit branch.

Depending upon the locations of the particular signal inputs and outputs in the circuit branch, as well as the use of additional circuit components, various logic functions can be performed by the circuit.

In this invention, a logic TRUE may be represented by a positive voltage, and a logic FALSE may be represented by a negative voltage. By using this logic representation or its complement, logic circuits can be constructed which are faster than RSFQ circuits by a factor of two. The push-pull flux quanta (PPFQ) approach of this invention can be readily implemented using high temperature superconductors because it is based on circuits made from non-hysteretic (shunted or crudely manufactured) Josephson tunnel junctions. This PPFQ technology offers the opportunity to build very low loss circuits (approximately 1 microwatt per gate) that can perform digital logic at ultra-high speeds (up to 1,000 gigahertz).

This invention encompasses not only PPFQ logic circuits, but also methods of operating such circuits to perform various logic functions.

BRIEF DESCRIPTION OF THE DRAWINGS

The present invention will be more readily apparent to those skilled in the art when discussed in terms of the following circuits illustrative of the preferred embodiments thereof, wherein:

FIGS. 2 through 16 are schematic diagrams of various circuits constructed in accordance with this invention. In particular, FIG. 2 is a schematic diagram of a dual polarity voltage signal repeater;

FIG. 3 is a schematic diagram of a modified version of the repeater of FIG. 2;

FIG. 4 is a schematic diagram of a dual polarity voltage signal splitter;

FIG. 5 is a schematic diagram of a modified version of the signal splitter of FIG. 4;

FIG. 6 is a schematic diagram of a dual polarity voltage signal conjunction;

FIG. 7 is a schematic diagram of a dual polarity voltage signal disjunction;

FIG. 8 is a schematic diagram of a positive to negative inverter;

FIG. 9 is a schematic diagram of a negative to positive inverter;

FIG. 10 is a schematic diagram of a modified version of the positive to negative inverter of FIG. 8;

FIG. 11 is a schematic diagram of a modified version of the negative to positive inverter of FIG. 9;

FIG. 12 is a positive to negative conjunction;

FIG. 13 is a negative to positive conjunction;

FIG. 14 is a positive to negative disjunction;

FIG. 15 is a negative to positive disjunction;

FIG. 16 is a signal separator;

DESCRIPTION OF THE PREFERRED EMBODIMENTS

The push-pull flux quanta (PPFQ) logic circuits of the preferred embodiments of this invention are based on the representation of a logic one or TRUE state by a positive voltage pulse, V(t), which has an area given by:

$$\int V(t)dt = +\Phi_O \quad (2)$$

and a logic zero or FALSE state by a negative voltage pulse, V(t), which has an area given by:

$$\int V(t)dt = -\Phi_O \quad (3)$$

where $\Phi_O$ (2.07×10$^{-15}$ webers) is a single flux quantum. It will be apparent to those skilled in the art, that a complementary definition of the TRUE and FALSE states could be applied. Therefore in alternative embodiments, a logic TRUE may be represented by a negative voltage pulse while a logic FALSE would be represented by a positive voltage pulse. By representing both logic states by active voltage pulses, logic can be performed without needing superconducting interferometers to trap the state of the computation nor timing pulses to read and reset the state of the interferometers. The use of a dual polarity voltage pulse therefore allows the data stream to transfer data at up to twice the frequency of the RSFQ logic circuits.

Figure 1:
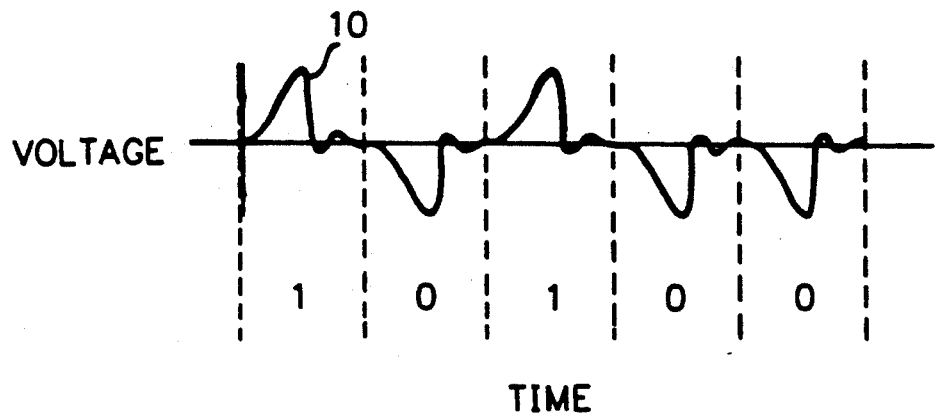
FIG. 1 is a waveform diagram which illustrates the type of signals which can be processed by the present invention.
Figure 2:
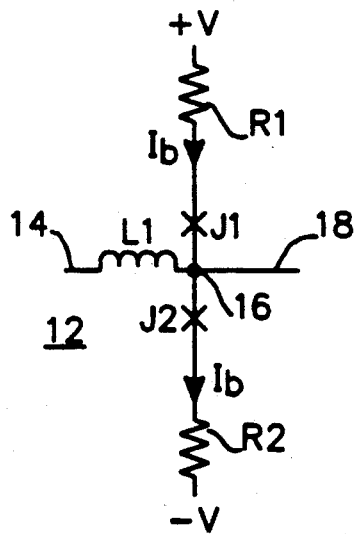

In the single-rail implementation, FIG. 1 is a waveform 10 which illustrates the type of dual polarity voltage data signals used by the present invention. One element needed to construct PPFQ logic circuits is a repeater to regulate signals along signal transmission lines. Signal repeaters are used as time delays in PPFQ logic circuits to synchronize parallel signal processing. FIG. 2 is a schematic diagram of a repeater 12 constructed in accordance with this invention. Josephson junctions J1 and J2 are electrically connected in series in a circuit branch which is connected to a source of positive voltage via resistor R1 and a source of negative voltage via resistor R2. This connection results in a bias current $I_b$ which should be set at about 75% of the junction critical currents $I_{c1} = I_{c2} = I_c$. A dual polarity input voltage signal is supplied on line 14 and connected to a node 16 by way of inductor L1. An output conductor 18 is also connected to node 16 and serves as a means for extracting an output signal from the circuit.

When a positive voltage pulse is present on the input conductor 14, Josephson junction J2 is momentarily switched off. This switching off of junction J2 causes a reinforced output voltage pulse, driven by the positive voltage power supply, to appear on conductor 18. When a negative voltage pulse is presented at the input, that voltage pulse causes junction J1 to momentarily switch off. This switching off of junction J1 causes a reinforced output voltage pulse, driven by the negative power supply, to appear on conductor 18. When no voltage pulse is present at the input, neither junction J1 nor junction J2 switch out of superconducting state. Therefore, the output voltage is determined by the voltage divider set by the resistances R1 and R2 between the two power supplies. Under ideal conditions (where R1 equals R2), this should result in a zero output voltage. However, in practice, this voltage will reflect optical imperfections in the photolithographic system used to construct the circuit. Thus, the circuit of FIG. 2 is seen to operate as a repeater, which amplifies the signal being transmitted along a discrete component transmission line.

Figure 3:
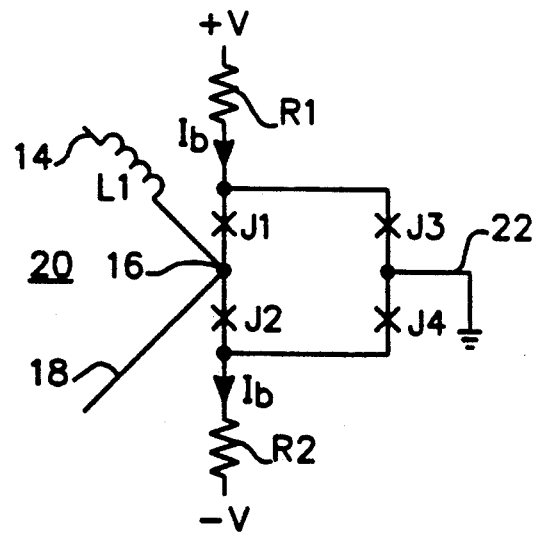

FIG. 2 is most suited for use as a low impedance buffer circuit. For applications where it is desirable to amplify the signal being transmitted, the circuit of FIG. 2 is modified by adding a second circuit branch comprising the series connection of Josephson junctions J3 and J4 as illustrated in FIG. 3. A junction point in that circuit branch between the Josephson junctions is connected to a neutral voltage point or ground via conductor 22. This arrangement provides for amplification of the input voltage signals such that the magnitude of those voltage signals on output line 18 is increased.

Another element needed to build the single-rail PPFQ logic circuits is a signal splitter which forms duplicate copies of the signal. Such a signal splitter is illustrated as item 24 in FIG. 4. Signal splitters operate in the same way as signal repeaters. The major differences are that the bias current set by resistors R3 and R4 is twice as large such that $I_b = 1.5\ I_c$ and the junction critical currents $I_{c1} = I_{c2} = 2I_c$, are twice as large as the corresponding critical currents for the junctions used in the repeater of FIGS. 2 and 3. Doubling the bias current and the junction critical currents can be used to increase the fan out of any device described. This feature is of particular importance to fundamental single-rail circuits for building NOT, AND, OR, NAND, and NOR gates, but will also be of value to building more complex circuits, because the time delay for computation can be minimized.

FIG. 5 is a schematic diagram of a modified dual polarity voltage signal splitter 28. This splitter adds a second circuit branch comprising the series connection of Josephson junctions J7 and J8. This circuit branch is connected in parallel with the primary circuit branch formed by Josephson junctions J5 and J6, and the junction point between junctions J7 and J8 is connected to ground by way of conductor 30.

Another element needed to build PPFQ logic circuits is a conjunction or hard-wired AND gate. The conjunction is used to perform logical calculations. FIG. 6 is a schematic diagram of a dual polarity voltage signal conjunction 32 which allows a string of positive signals on either of two input lines 34 or 36 to be conjoined with a string of orthogonal negative polarity voltage signals on either line 36 or 34 respectively. Junctions J1 and J2 are designed to switch and form a conjunctive output on line 38.

Another element needed to build PPFQ logic circuits is a disjunction or hard-wired OR gate. The disjunction is also used to perform logical calculations. FIG. 7 is a schematic diagram of dual polarity voltage signal disjunction 40 which allows a string of positive signals on either input line 42 or 44 to be combined with a string of orthogonal negative signals on either line 42 or 44. The circuit of FIG. 7 differs from that of FIG. 6 in that Josephson junction J9 and J10 have been inserted in series with the input lines 42 and 44 respectively. Junctions J1 and J2 are designed to switch and form the disjunctive output on line 46.

Figure 8:
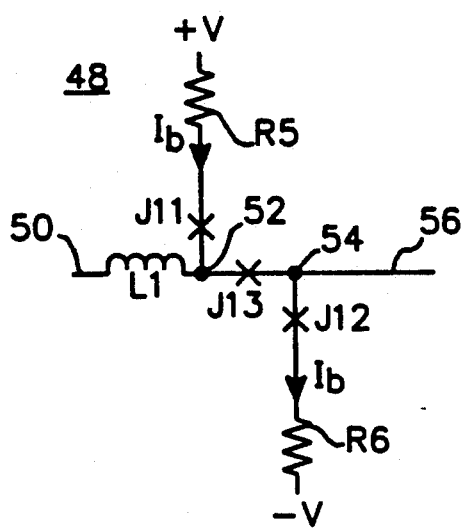

A signal inverter is required to change the polarity of the signal components. Signal inverters are required for circuits which do not use dual-rail logic. FIG. 8 is a schematic diagram of a positive to negative signal inverter 48 constructed in accordance with one embodiment of this invention. A circuit branch comprising the series connection of Josephson junctions J11, J12 and J13 is connected between positive and negative voltage sources via resistors R5 and R6 respectively as shown. Again, the bias current $I_b$ is set at about 75% of the junction critical currents $I_c$. An input line 50 is connected through inductor L1 to a first node 52 in the Josephson junction circuit branch. A second node 54 is connected to an output conductor 56. When a positive polarity voltage pulse is present on line 50, this voltage pulse causes Josephson junction J13 to momentarily switch off. This isolates the input from the output and causes a negative voltage pulse to be present on output conductor 56. Junction J11 and J12 isolate the voltage sources from the input/output signal lines. The negative to positive inverter 58 illustrated in FIG. 9 operates in a similar manner to the inverter of FIG. 8.

Figure 10:
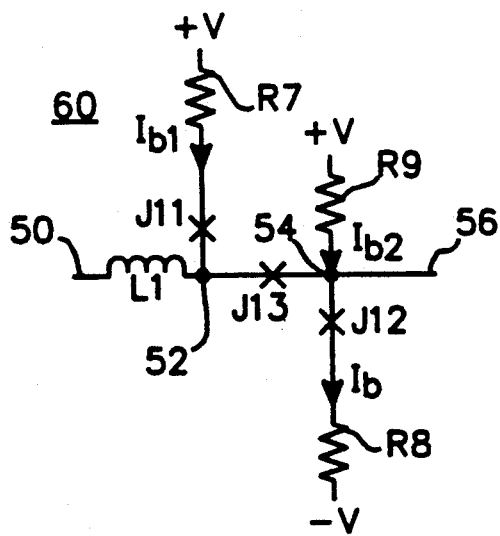

The modified positive to negative inverter of FIG. 10 substitutes resistors R7 and R8 for resistors R5 and R6 in FIG. 8 and adds additional resistor R9 so that an additional bias current $I_{b2}$ is supplied at node 54. This results in an amplification of the output signal on line 56.

Figure 9:
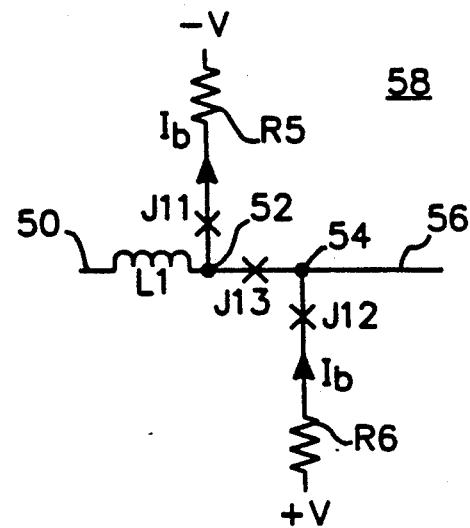
Figure 11:
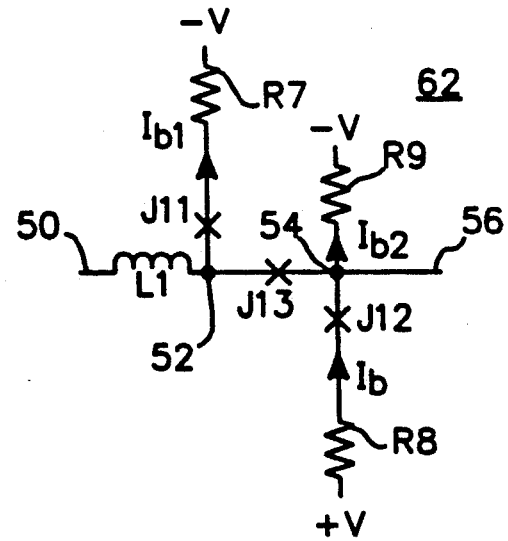

The modified negative to positive inverter 62 illustrated in FIG. 11 is similar to the negative to positive inverter of FIG. 9 except that resistors R5 and R6 have been replaced by resistors R7 and R8 and additional resistor R9 has been added. Here again, this results in an amplified output signal on line 56.

Figure 12:
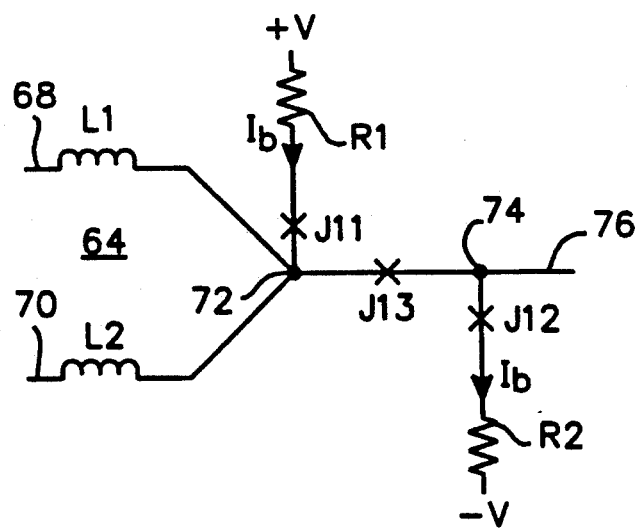
Figure 13:
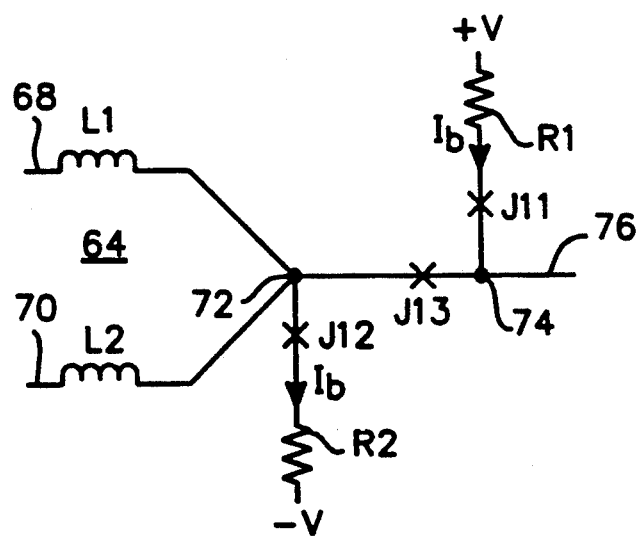

The circuits illustrated in the schematic diagrams of FIGS. 12 and 13 are a positive to negative conjunction 64 and a negative to positive conjunction 66. These circuits are hard-wired NAND circuits which are used to perform logical calculations. Input signals on lines 68 and 70 are coupled to a first node 72 and the output signal at node 74 appears on line 76 as an inverted NAND function of the input signals.

Figure 14:
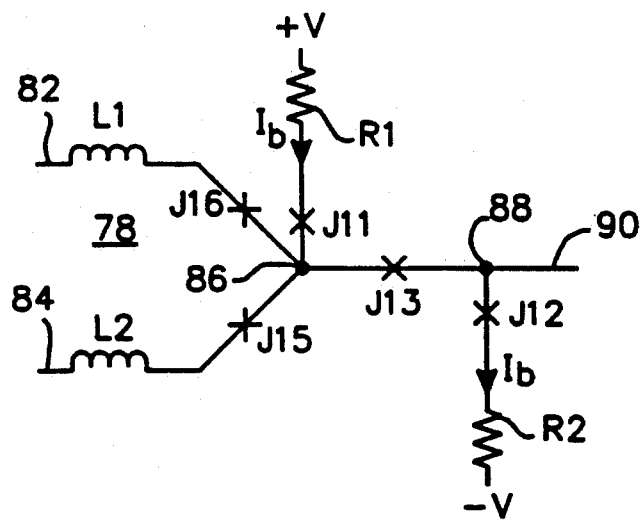
Figure 15:
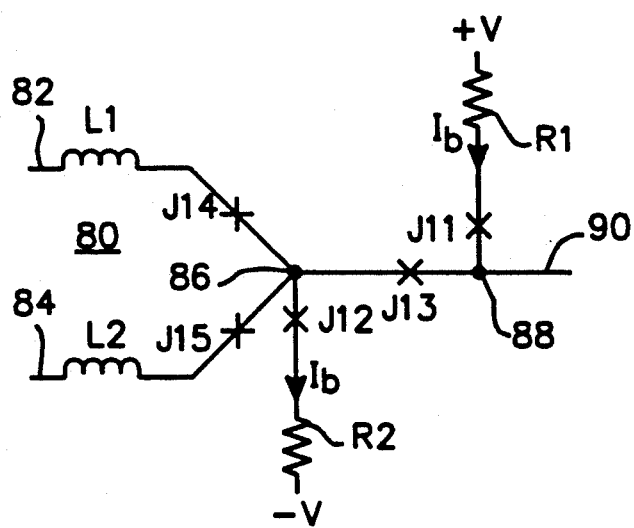

The schematic diagrams of FIGS. 14 and 15 show a positive to negative disjunction 78 and a negative to positive disjunction 80 respectively. These circuits are similar to the circuits of FIGS. 12 and 13 except that Josephson junctions J14 and J15 have been inserted in input lines 82 and 84 respectively. Input signals on lines 82 and 84 are coupled to a first node 86 in the circuit branch comprising junctions J11, J12 and J13. Node 88 serves as an output point for the connection of an output conductor 90. Circuits 14 and 15 are hard wired NOR circuits.

Figure 16:
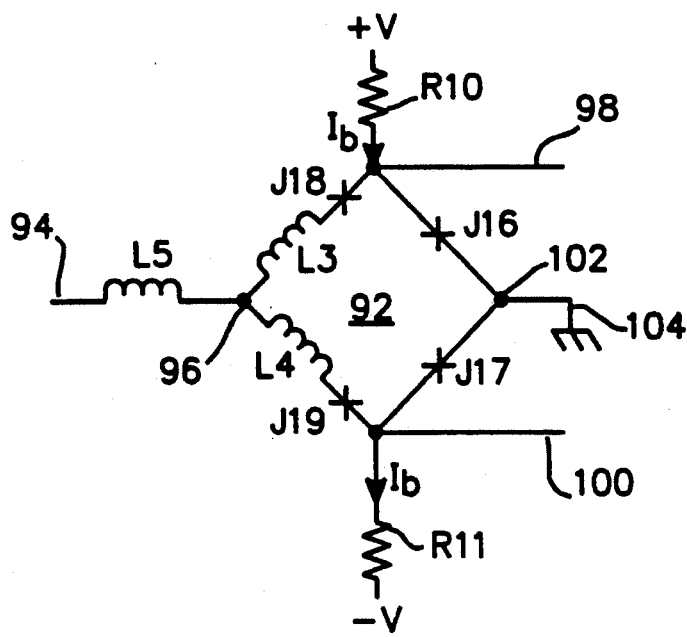

FIG. 16 is a schematic diagram of a signal separator 92 which is used to dissect the dual polarity input voltage signals into their positive polarity and negative polarity parts. A first circuit branch comprising the series connection of Josephson junctions J16 and J17 is electrically connected between a positive and negative voltage source by way of resistors R10 and R11. A second circuit branch, comprising the series connection of Josephson junctions J18 and J19 and inductors L3 and L4, is electrically connected in parallel with the first circuit branch. An input line 94 is connected to a first node 96 in the second circuit branch by way of inductor L5. Output lines 98 and 100 are used to extract signals at opposite ends of the parallel connection of first and second circuit branches. A junction point 102 between junctions J16 and J17 is connected by way of conductor 104 to ground.

In FIG. 16, the bias current $I_b$ is again set to about 75% of the junction critical currents $I_c$. When a positive voltage pulse is present on line 94, this voltage pulse causes junction J16 to momentarily switch off. The switching off of junction J16 causes a reinforced voltage pulse to be present on output line 98. When a negative voltage pulse is present at the input, that voltage pulse causes junction J17 to momentarily switch off. This switching off of junction J17 causes a reinforced positive voltage pulse on output line 100. Finally, when no voltage pulses are present at the input, neither junctions J16 nor J17 switch. Therefore, the result is a zero voltage on both outputs. Junctions J18 and J19 isolate the input from the outputs.

Figure 17:
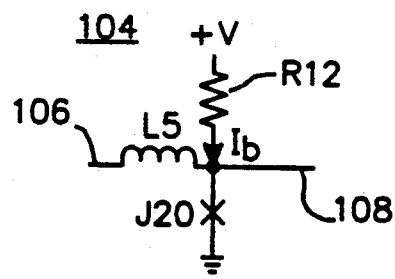
FIG. 17 is a positive signal repeater.
Figure 18:
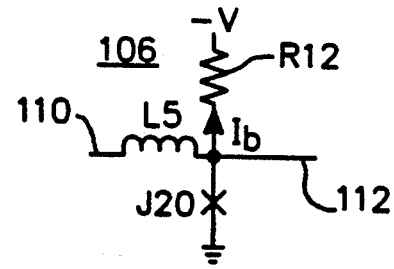
FIG. 18 is a negative signal repeater.

FIGS. 17 and 18 illustrate a positive signal repeater 104 and a negative signal repeater 106. A voltage source, in combination with resistor R12, establishes a bias current $I_b$ at about 75% of the critical current of Josephson junction J20. In FIG. 17, a positive input signal on line 106 passes through inductor L5 and results in a positive output signal on line 108 after a time delay. In FIG. 18, a negative signal on line 110 passes through inductor L5 and results in a negative output signal on line 112. Time delays are used in PPFQ logic circuits to synchronize parallel signal processing.

Figure 19:
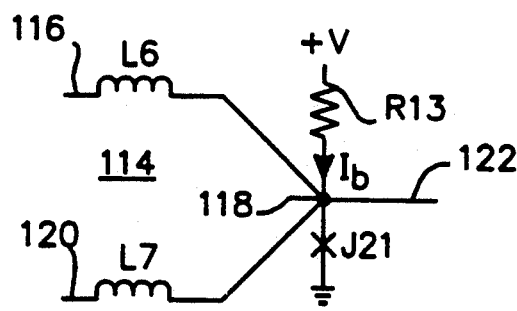
FIG. 19 is a positive signal conjunction.
Figure 20:
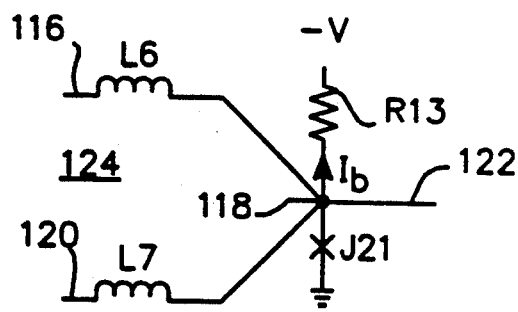
FIG. 20 is a negative signal conjunction.

FIG. 19 is a schematic diagram of a positive signal conjunction or hard-wired AND 114. Here again, the voltage source in combination with resistor R13 provides a bias current to junction J21. A string of positive voltage signals on line 116 is connected via inductor L6 to junction point 118. Similarly, a string of positive signals on line 120 is connected via inductor L7 to junction point 118. The output signal on line 122 then consists of the conjoined string of positive signals on lines 116 and 120. FIG. 20 is a negative signal conjunction 124 which is similar to FIG. 19 except that the polarity of the voltage source has been reversed.

Figure 21:
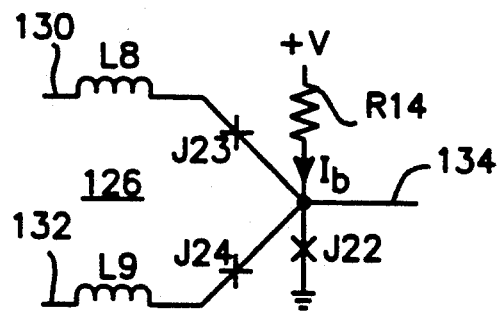
FIG. 21 is a positive signal disjunction.
Figure 22:
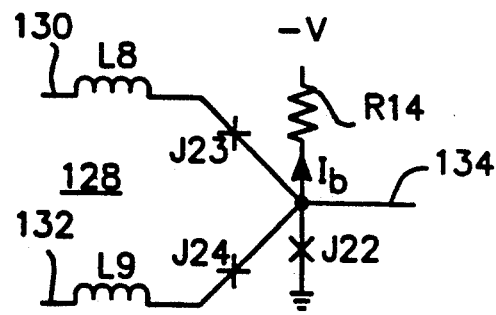
FIG. 22 is a negative signal disjunction.

FIGS. 21 and 22 are a positive disjunction or hard-wired OR 126 and a negative disjunction or hard-wired OR 128. Here again, the voltage source in combination with resistor R14 sets a bias current $I_b$ through junction J22. In FIG. 21, a positive signal on line 130 is disjoined with a negative signal on line 132 to produce an OR output signal on line 134. In FIG. 22, a negative input signal on line 130 is disjoined with a negative input signal on line 132 to produce an OR output signal on line 134. Junctions J23 and J24 serve to isolate the two input data streams from each other.

Non-superconducting materials, including semiconductors, do not exhibit coherent behavior. Coherent phenomena results in quantum relationships for the macroscopic variables which are used to characterize the material behavior. In particular, the phase of a quantum mechanical wave function disappears in characterizing non-coherent materials because the macroscopic quantities, such as current and voltage, are sums over many particles. Classical relationships among macroscopic quantities are summarized by Maxwell's equations (which includes Kirchoff's current and voltage laws).

Superconducting materials do exhibit a coherent behavior. The phase of the superconducting material does not disappear during the summing over many particles because the particles of the material are phase locked together and described by only one wave function. This quantum behavior of coherent materials leads to a super-conductor's zero resistivity, the Meissner effect, the magnetic flux quantization and the Josephson tunneling effect. The coherent nature of superconducting materials makes them quite different from semiconducting and normal conducting materials. Since all materials obey the laws of quantum mechanics, both superconductors and semiconductors obey Kirchoff's voltage and current laws. However, because of its coherency, superconductors also must satisfy Schrodinger's wave equation, retaining a single phase angle for the wave function of the superconducting particles. This additional relationship for superconducting materials is what separates superconductive electronics from semiconductive electronics.

The differences between superconductive and semiconductive electronics, coupled with the preferred logic representation scheme in which a logic TRUE is a positive voltage and a logic FALSE is zero voltage, have required that traditional digital superconductive circuits use a timing signal for signal inversion. By making a linear change in logic representation such that a logic TRUE is a positive voltage and a logic FALSE is a negative voltage or the complementary version, the present invention can perform signal inversion without the use of a timing signal. This leads to reduced circuit complexity and increased signal processing speed.

Although the present invention has been described in terms of its preferred embodiments, it will be apparent to those skilled in the art that various changes may be made without departing from the scope of the invention. It is therefore intended that the appended claims cover such changes.

What is claimed is:
1. A superconducting digital logic circuit comprising:
   a first circuit branch including first and second Josephson junctions electrically connected in series with each other;
   means for applying a positive bias voltage to a first end of said circuit branch;
   means for applying a negative bias voltage to a second end of said circuit branch;
   means for applying a first dual polarity input voltage signal to a first node in said circuit branch; and
   means for extracting a first output voltage signal from said first node in said circuit branch.
2. A superconducting digital logic circuit as recited in claim 1, wherein:
   said means for applying a positive bias voltage signal to said first end of said circuit branch comprises a first resistor; and said means for applying a negative bias voltage signal to said second end of said circuit branch comprises a second resistor.
3. A superconducting digital logic circuit as recited in claim 1, wherein:
   said means for applying a first input voltage signal to said first node in said first voltage branch comprises a first inductor.
4. A superconducting digital logic circuit as recited in claim 1, further comprising:
   means for applying a second input voltage signal to said first node in said circuit branch.
5. A superconducting digital logic circuit as recited in claim 4, wherein:
   said means for applying a first input voltage signal to said first node in said first voltage branch comprises a first inductor; and
   said means for applying a second input voltage signal to said first node in said first voltage branch comprises a second inductor.
6. A superconducting digital logic circuit as recited in claim 5, wherein:
   said means for applying a first input voltage signal to said first node in said first voltage branch further comprises a third Josephson junction electrically connected in series with said first inductor; and
   said means for applying a second input voltage signal to said first node in said first voltage branch further comprises a fourth Josephson junction electrically connected in series with said second inductor.
7. A superconducting digital logic circuit comprising:
   a first circuit branch including first and second Josephson junctions electrically connected in series with each other;
   means for applying a positive bias voltage to a first end of said circuit branch;
   means for extracting a negative bias voltage to a second end of said circuit branch;
   means for applying a first input voltage signal to a first node in said circuit branch;
   means for extracting a first output voltage signal from said first node in said circuit branch;
   a second circuit branch electrically connected in parallel with said first circuit branch, said second circuit branch including third and fourth Josephson junctions electrically connected in series with each other; and
   means for connecting a junction point between said third and fourth Josephson junctions to a neutral voltage point.
8. A superconducting digital logic circuit comprising:
   a first circuit branch including first and second Josephson junctions electrically connected in series with each other;
   means for applying a positive bias voltage to a first end of said circuit branch;
   means for applying a negative bias voltage to a second end of said circuit branch;
   means for applying a first input voltage signal to a first node in said circuit branch;
   means for extracting a first output voltage signal from said first node in said circuit branch; and
   a second means for extracting said output voltage signal from said first node in said circuit branch.
9. A superconducting digital logic circuit as recited in claim 8, further comprising:

a second circuit branch electrically connected in parallel with said first circuit branch, said second circuit branch including third and fourth Josephson junctions electrically connected in series with each other; and means for connecting a junction point between said third and fourth Josephson junctions to a neutral voltage point.

10. A superconducting digital logic circuit comprising:
a first circuit branch including first and second Josephson junctions electrically connected in series with each other;
means for applying a positive bias voltage to a first end of said circuit branch;
means for applying a negative bias voltage to a second end of said circuit branch;
means for applying a first input voltage signal to a first node in said circuit branch;
means for extracting a first output voltage signal from said first node in said circuit branch; and
wherein said first circuit branch further includes a third Josephson junction electrically connected in series between said first and second Josephson junctions, such that said first node is located between said first and third Josephson junctions and a second node is located between said second and third Josephson junctions.

11. A superconducting digital logic circuit as recited in claim 10, wherein:
said means for applying a first input voltage signal to said first node in said first voltage branch comprises a first inductor.

12. A superconducting digital logic circuit as recited in claim 10, further comprising:
means for applying a second input voltage signal to said first node in said circuit branch.

13. A superconducting digital logic circuit as recited in claim 12, wherein:
said means for applying a first input voltage signal to said first node in said first voltage branch comprises a first inductor; and
said means for applying a second input voltage signal to said first node in said first voltage branch comprises a second inductor.

14. A superconducting digital logic circuit as recited in claim 12, wherein:
said means for applying a first input voltage signal to said first node in said first circuit branch further comprises a fourth Josephson junction electrically connected in series with said first inductor; and
said means for applying a second input voltage signal to said first node in said first circuit branch further comprises a fifth Josephson junction electrically connected in series with said second inductor.

15. A superconducting digital logic circuit as recited in claim 10, further comprising:
means for applying said positive bias voltage to said second node.

16. A superconducting digital logic circuit as recited in claim 10, further comprising:
means for applying said negative bias voltage to said second node.

17. A superconducting digital logic circuit comprising:
a first circuit branch including first and second Josephson junctions electrically connected in series with each other;

a second circuit branch including third and fourth Josephson junctions electrically connected in series with each other, said second circuit branch being electrically connected in parallel with said first circuit branch;
means for applying a positive bias voltage to a first end of said first and second circuit branches;
means for applying a negative bias voltage to a second end of said first and second circuit branches;
means for connecting a junction point between said first and second Josephson junctions to a neutral voltage point;
means for applying a first dual polarity input voltage signal to a first node in said second circuit branch;
means for extracting a first output voltage signal from said first end of said first circuit branch; and
means for extracting a second output voltage signal from said second end of said first circuit branch.

18. A superconducting digital logic circuit as recited in claim 17, wherein said second circuit branch further includes:
first and second inductors electrically connected in series with each other between said third and fourth Josephson junctions, said first node in said second circuit branch being a junction point between said first and second inductors.

19. A superconducting digital logic circuit as recited in claim 18, wherein:
said means for applying said first dual polarity input voltage signal includes a third inductor.

20. A superconducting digital logic circuit comprising:
a first circuit branch including a first Josephson junction electrically connected between a first node and a neutral point;
means for applying a bias voltage to said first node;
means for applying a first input voltage signal to said first node;
means for applying a second input voltage signal to said first node; and
means for extracting an output voltage signal from said first node;
wherein said means for applying a first input voltage signal to said first node includes a first inductor and a second Josephson junction electrically connected in series with said first inductor; and
wherein said means for applying a second input voltage to said first node includes a second inductor and a third Josephson junction electrically connected in series with said second inductor.

21. A method of performing digital logic in a superconducting circuit, said method comprising the steps of:
applying a bias voltage having a first polarity to a first end of said circuit branch including at least two Josephson junctions electrically connected in series with each other;
applying a bias voltage having a second polarity to a second end of said circuit branch;
applying a first dual polarity input voltage signal to a first node in said circuit branch; and
extracting a first output voltage signal from said first node in said circuit branch.

22. A method of performing digital logic in a superconducting circuit as recited in claim 21, said method further comprising the step of:
applying a second input voltage signal to said first node in said circuit branch.

23. A method of performing digital logic in a superconducting circuit as recited in claim 22, wherein:
said first and second input voltage signals are dual polarity signals.

24. A method of performing digital logic in a superconducting circuit as recited in claim 22, wherein:
said step of applying a first input voltage signal to a first node in said circuit branch includes the step of coupling said first input voltage signal to said first node through a third Josephson junction; and
said step of applying a second input voltage signal to a first node in said circuit branch includes the step of coupling said second input voltage signal to said first node through a fourth Josephson junction.

25. A method of performing digital logic in a superconducting circuit as recited in claim 21, said method further comprising the step of:
extracting a second output voltage signal from said first node in said circuit branch.

26. A method of performing digital logic in a superconducting circuit, said method comprising the steps of:
applying a bias voltage having a first polarity to a first end of a circuit branch including at least three Josephson junctions electrically connected in series with each other;
applying a bias voltage having a second polarity to a second end of said circuit branch;
applying a first dual polarity input voltage signal to a first node in said circuit branch; and
extracting a first output voltage signal from a second node in said circuit branch.

27. A method of performing digital logic in a superconducting circuit as recited in claim 26, said method further comprising the step of:
applying a second input voltage signal to said first node in said circuit branch.

28. A method of performing digital logic in a superconducting circuit as recited in claim 27, wherein:
said first and second input voltage signals are dual polarity signals.

29. A method of performing digital logic in a superconducting circuit as recited in claim 27, wherein:
said step of applying a first input voltage signal to a first node in said circuit branch includes the step of coupling said first input voltage signal to said first node through a fourth Josephson junction; and
said step of applying a second input voltage signal to a first node in said circuit branch includes the step of coupling said second input voltage signal to said first node through a fifth Josephson junction.

30. A method of performing digital logic in a superconducting circuit, said method comprising the steps of:
applying a bias voltage having a first polarity to a first end of first and second circuit branches, said first circuit branch including first and second Josephson junctions electrically connected in series with each other, and said second circuit branch including third and fourth Josephson junctions electrically connected in series with each other, said second circuit branch being electrically connected in parallel with said first circuit branch;
applying a bias voltage having a second polarity to a second end of said first and second circuit branches;
connecting a junction point between said first and second Josephson junctions to a neutral voltage point;
applying a first input voltage signal to a first node in said second circuit branch;
extracting a first output voltage signal from said first end of said first circuit branch; and
extracting a second output voltage signal from said second end of said first circuit branch.

31. A method of performing digital logic in a superconducting circuit as recited in claim 30, wherein:
said first input voltage signal is a dual polarity signal.

32. A method of performing digital logic in a superconducting circuit, said method comprising the steps of:
applying a bias voltage to a first node in a first circuit branch including a first Josephson junction electrically connected between said first node and a neutral point;
applying a first input voltage signal to said first node;
applying a second input voltage signal to said first node; and
extracting an output voltage signal from said first node;
wherein said first input voltage signal is applied to said first node through a first inductor and a second Josephson junction electrically connected in series with each other; and
wherein said second input voltage signal is applied to said first node through a second inductor and a third Josephson junction electrically connected in series with each other.

* * * * *